US011892865B2

(12) United States Patent
Wu

(10) Patent No.: US 11,892,865 B2
(45) Date of Patent: Feb. 6, 2024

(54) MIXED-SIGNAL CONTROL CIRCUIT FOR ELIMINATING DEGENERATE METASTABLE STATE OF BANDGAP REFERENCE CIRCUIT

(71) Applicant: EXCELIO TECHNOLOGY (SHENZHEN) CO., LTD., Shenzhen (CN)

(72) Inventor: Patrick Bian Wu, Shenzhen (CN)

(73) Assignee: EXCELIO TECHNOLOGY (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/925,302

(22) PCT Filed: Oct. 12, 2021

(86) PCT No.: PCT/CN2021/123264
§ 371 (c)(1),
(2) Date: Nov. 14, 2022

(87) PCT Pub. No.: WO2022/142579
PCT Pub. Date: Jul. 7, 2022

(65) Prior Publication Data
US 2023/0179177 A1  Jun. 8, 2023

(30) Foreign Application Priority Data
Dec. 29, 2020 (CN) .......................... 202011598564.1

(51) Int. Cl.
*G05F 3/30* (2006.01)
*G05F 1/56* (2006.01)
(Continued)

(52) U.S. Cl.
CPC .................. *G05F 3/30* (2013.01); *G05F 1/56* (2013.01); *H03K 5/01* (2013.01); *H03M 1/66* (2013.01); *H03K 2005/00078* (2013.01)

(58) Field of Classification Search
USPC .................. 327/312, 513, 539; 323/313-317
See application file for complete search history.

(56) References Cited

U.S. PATENT DOCUMENTS 7,436,244 B2 * 10/2008 Lin ........................... G05F 3/30
327/539
7,969,127 B1  6/2011 Megaw
(Continued)

FOREIGN PATENT DOCUMENTS

CN   102385405 A   3/2012
CN   104090619 A   10/2014
(Continued)

OTHER PUBLICATIONS

World Intellectual Property Organization (WIPO) International Search Report for PCT/CN2021/123264 dated Jan. 11, 2022 6 pages.

*Primary Examiner* — Thomas J. Hiltunen
(74) *Attorney, Agent, or Firm* — ANOVA LAW GROUP, PLLC

(57) ABSTRACT

The present disclosure relates to the field of analog integrated circuit technology. A digital and analog mixed signal control circuit for eliminating a degenerate metastable state of a self-biased bandgap reference circuit utilizes a digital-to-analog converter module with low-power consumption and flexibly customized accuracy as needed, a delay switch, and a non-volatile memory cell to directly control and clamp a circuit node at the degenerate metastable state in the bandgap reference circuit module, and to release the clamping after a certain delay. Such control mechanism effectively prevents the self-biased bandgap reference circuit with an operational amplifier from entering the degenerate meta- (Continued)

stable state, and enhance robustness of the circuit, such that the reference circuit is capable of starting normally under various conditions, which improves the performance and yield of the products.

8 Claims, 7 Drawing Sheets

(51) Int. Cl.
   *H03K 5/01* (2006.01)
   *H03M 1/66* (2006.01)
   *H03K 5/00* (2006.01)

(56) References Cited

U.S. PATENT DOCUMENTS

| | | | | |
|---|---|---|---|---|
| 8,786,358 B2* | 7/2014 | Endo | ............... | G05F 3/245 |
| | | | | 327/539 |
| 10,747,254 B1* | 8/2020 | Fang | ............... | G05F 3/245 |
| 2023/0046259 A1* | 2/2023 | Iqbal | ............... | G11C 5/148 |

FOREIGN PATENT DOCUMENTS

| | | |
|---|---|---|
| CN | 203982247 U | 12/2014 |
| CN | 106155160 A | 11/2016 |
| CN | 108227819 A | 6/2018 |
| CN | 109917842 A | 6/2019 |
| CN | 112698680 A | 4/2021 |

\* cited by examiner

MIXED-SIGNAL CONTROL CIRCUIT FOR ELIMINATING DEGENERATE METASTABLE STATE OF BANDGAP REFERENCE CIRCUIT

CROSS-REFERENCES TO RELATED APPLICATION

This application is a national phase entry under 35 U.S.C § 371 of International Application PCT/CN2021/123264, filed Oct. 12, 2021, which claims priority of Chinese Patent Application No. 202011598564.1, filed Dec. 29, 2020, the entire content of all of which are incorporated herein by reference.

FIELD OF THE DISCLOSURE

The present disclosure generally relates to the field of analog integrated circuit technology and, more particularly, relates to a digital and analog mixed signal control circuit for eliminating a degenerate metastable state of a self-biased bandgap reference circuit in the ultra-low power consumption application field of passive radio frequency identification tags.

BACKGROUND

The bandgap reference circuit is widely used in the analog circuit part of the semiconductor integrated circuit chip, and provides a stable and accurate reference voltage that hardly changes with temperature for the semiconductor integrated circuit chip. The reference voltage is often used as a reference input signal of a power management module in the semiconductor integrated circuit chip, to generate a stable power supply voltage required by the system. Therefore, in a system architecture of a general semiconductor integrated circuit chip, the bandgap reference circuit is often the first module to be turned on in all circuit modules, rather than is controlled by a bias control signal outside of the bandgap reference circuit module, because at this time, the system has not yet generated a stable power supply and cannot specify the logic control signal determined by the logic level. The bandgap reference circuit often adopts a self-starting method. In other words, during the power-on process of the power supply of the semiconductor integrated circuit chip, a self-starting circuit sub-module inside the bandgap reference circuit enters a normal working state of a pre-designed DC operating point from a fully turned-off initial state, thereby completing the self-starting process. When the bandgap reference circuit operates at the normal DC operating point, all the DC voltage of each circuit node and the DC current of each circuit branch have pre-designed values.

In a more complex system architecture of the semiconductor integrated circuit chip, there may be more than one bandgap reference circuit modules, which may be due to a case where multiple reference voltages with different values in the system architecture are required, or due to a case where different reference voltage modules are needed to achieve different performance indicators (such as different power supply voltage range, different power consumption, and different temperature points to achieve the optimal zero temperature coefficient, etc.), or due to a case where the integrated circuit subsystem itself, such as an externally procured circuit IP module integrated as a black box, has a reference voltage module, etc. Such type of bandgap reference circuit module, which exists in one semiconductor integrated circuit system with other bandgap reference circuit modules, on the basis of its own start-up capability, may also be activated by a control signal outside of its own circuit module to enter the normal operating state.

The reason why the bandgap reference circuit can generate a stable and accurate reference voltage that does not change with temperature changes is due to the function of the feedback loop. In terms of topology structure, most of the bandgap reference circuits contain two feedback loops. A physical quantity with a positive temperature coefficient, such as a voltage at a node, and a physical quantity with a negative temperature coefficient, such as a voltage at another node, are added at the intersection of the two feedback loops to obtain a physical quantity whose positive temperature coefficient and negative temperature coefficient almost fully cancel each other, namely the voltage at the output node of the bandgap reference circuit.

Similar to the principle of all feedback loops in an analog circuit, the above-described feedback loop has an effect of error correction. Due to the existence of the error correction function, the voltage at each node of the feedback loop in the bandgap reference circuit is accurately limited to the pre-designed DC operating point, and does not change with the temperature drift and the change of the operating state of the external circuit, such that the output voltage of the bandgap reference circuit will be stable and accurate. In circuit practice known in the industry, the error correction function, in other words, the addition operation performed on the aforementioned topology structure is provided by a differential amplifier with a dual-port input. Taking the simplest single-stage differential amplifier as an example, under the bias of a bias current source, the differential pair transistor formed by a pair of PMOS transistors or a pair of NMOS transistors amplifies the difference between the input voltage of the positive feedback loop and the input voltage of the negative feedback loop, and a typical gain multiple is 60 dB (i.e., 1000 times). The amplified differential signal is outputted to the intersection of the above two feedback loops after passing through the output load of the differential pair transistor, to achieve the control of the voltage at the intersection by the negative feedback loop. Because the intersection is the node in the feedback system that controls the bandgap reference voltage output, the bandgap reference output voltage is a stable and accurate value.

However, in the field of semiconductor integrated circuit chip design, the realization of differential amplifier is subject to various factors.

First, the input range of the common-mode voltage of the differential pair transistor formed by either PMOS transistors or NMOS transistors is limited. Here, the common-mode input voltage is defined as half the sum of a node voltage at the positive input terminal and a node voltage at the negative input terminal. The reason for the limited common-mode input voltage range includes that the current source MOS transistor that provides bias current to the differential pair transistor requires a certain overdrive voltage margin to satisfy the condition for operating in a saturated state. Only when operating in the saturated state, the bias current becomes a stable DC current that does not change with change in the input voltage of the differential pair transistor. In other words, the output impedance of the DC current source is substantially large (ideally, the output impedance of the current source is infinitely large). When the input common-mode voltage of the differential pair transistor is too low (for NMOS differential pair transistor) or too high (for PMOS differential pair transistor), the current source MOS transistor on which the input differential pair transistor depends will change from a state of operating in the saturated region to a state of operating in a linear region (also known as an amplification region). The direct consequence includes that the bias current of the differential pair transistor deviates from the value of pre-designed DC operating point, and changes with the change in the common-mode voltage of the input signal. Therefore, the amplifier gain provided by the differential pair transistor changes, and the unity-gain bandwidth of the differential amplifier has also changed, in other words, both the error correction capability and the error correction response time have changed.

Secondly, in the field of radio frequency identification tag chip that the present disclosure focuses on, because the radio frequency identification tag is passive during operation, and the energy comes from the direct current obtained by rectifying and converting the alternating current which is obtained after the radio frequency electromagnetic field is coupled by the antenna. The obtained energy from the antenna coupling is inversely proportional to the cube of the communication distance, to obtain the farthest possible communication distance, the circuit inside the chip should consume as little power as possible. Such factor limits many complex circuit processing structures. For example, the rail-to-rail dual-input differential pair transistor structure with both PMOS and NMOS transistors, which is commonly used in the industry and has the ability to extend the common-mode input range, cannot be used in the RFID tag chip.

The bandgap reference circuit, whether it is started by a self-starting circuit or started by an external control signal, may face the problem of metastable degenerate point due to a fact that the differential amplifier is limited and restricted by various factors. The so-called degenerate point refers to an operating state of the circuit in which some circuit node voltages stabilize in an operating state that the designer did not expect, which is significantly different from the full rest state in which all node voltages of the circuit are zero and all branch currents are zero, and is also significantly different from the normal operating state in which all node voltages and branch currents are in the pre-designed DC operating points. The state of the circuit at the degenerate point is often not a very stable state, and, thus, it is called metastable state. A circuit that is in the metastable state may go through a very long transient transition process to reach a steady state, such as returning to a turned-off state, or entering a normal operating state. In a circuit system where the startup sequence of each module or the start-up time of each module is critical, even if the circuit at the metastable degenerate point can ultimately enter the normal start-up state, unintended consequences will occur due to abnormally long start-up time.

As a detailed elaboration of the above-mentioned problems, an industrial example is given to illustrate. The RFID tag chip required for animal identification and high-end livestock breeding in current animal husbandry is regulated by ISO11784/11785 technical standards, and the packaged finished product has a basic electronic identification function in the form of passive electronic ear tag or passive glass tube injection electronic tag. However, the substantially high-end market demand of animal husbandry is to simultaneously monitor the health status of animals on the basis of electronic identification, such as key biological health indicators such as the body temperature of livestock. Therefore, the integration of passive temperature sensor functions on the basis of passive RFID tag chip is required. The passive RFID tag chip with integrated temperature sensor has several important characteristics of the problems faced by the aforementioned bandgap reference circuit: 1) the chip system architecture contains more than one bandgap reference circuit modules; 2) the bandgap reference circuit module in the temperature sensor subsystem not only has a self-starting circuit, but also can be activated by an external mode conversion control signal to start, for example, the radio frequency identification circuit part sends a temperature measurement enable signal to the bandgap reference circuit module in the temperature sensor; 3) because the product is a passive chip product, low complexity and low power consumption in terms of circuit structure and power consumption strive to be achieved. Therefore, it can be predicted that the amplifier required by the bandgap reference circuit in the temperature sensor subsystem is also subjected to several constraints that have been described earlier. Further, in the temperature sensor subsystem of the above-mentioned passive RFID tag chip integrated with the temperature sensor, if the bandgap reference circuit has a metastable degenerate point, the execution time of the temperature measurement advanced instruction will be obviously affected, thereby affecting the signal processing timing and response speed of the entire chip system, and eventually leading to temperature measurement failure due to failing to switch to the temperature measurement mode. In a typical response operation of the passive RFID tag chip, the response time with uncertain delay factor will lead to user experience of the unsmooth response of the electronic tag and the insensitive communication, and even lead to the failure of product promotion. From the point of view of power consumption, if the system experiences metastable state for too long, the bandgap reference circuit tends to have a high current state, and thus consumes substantially large power consumption, which is unfavorable for the passive RFID tag.

In existing technology, one of the methods to solve the metastable degenerate point that the bandgap reference circuit may encounter during the startup process includes increasing the bandwidth of the feedback loop and increasing the loop gain, such as reference [1]: Yeong-Tsair Lin, Wen-Yaw Chung, Dong-Shiu Wu, Ho-Cheng Lin, and Robert Lin, A Low Voltage CMOS Bandgap Reference, Proceedings of the 3rd International IEEE-NEWCAS Conference, 2005, DOI: 10.1109/NEWCAS. 2005.1496749, ISBN: 0-7803-8934-4, and Reference [2]: Hande Vinayak Gopal, and Maryam Shojaei Baghini, Trimless, PVT Insensitive Voltage Reference using Compensation of Beta and Thermal Voltage, 2014 27th International Conference on VLSI Design and 2014 13th International Conference on Embedded Systems, pp 528-533, DOI: 10.1109/VLSID.2014.98. The purpose of these techniques is to enhance the error correction capability of the feedback loop. In other words, when the bandgap reference circuit module deviates from its pre-designed DC operating point, the feedback loop can quickly and accurately pull each node of the bandgap reference circuit to the DC operating point and stabilize the node. During the start-up process, similarly, the error correction capability of the feedback loop can make the start-up process avoid falling into the metastable degenerate point. However, such method is not a method to directly repair the common-mode input voltage range of the differential amplifier in the loop, and will consume a large amount of power. On the basis of consuming a certain current power consumption, the bandwidth and gain of the feedback loop will still be affected by the high level or low level of the power supply voltage, the temperature drift, and the fluctuation of semiconductor chip processing parameters. In the passive RFID tag chip system, such technology affects the energy use efficiency and causes the deviation of the bandgap reference output voltage, and, thus, has certain limitations.

Another approach is to directly extend the common-mode input range of the differential amplifier in the feedback loop. In the circuit structure known in the industry, the rail-to-rail dual differential input structure can achieve the maximum common-mode input range from the power supply voltage to the ground wire, such as reference [3]: William Redman-White, A High Band Width Constant gm and Slew-Rate Rail-to-Rail CMOS Input Circuit and Its Application to Analog Cells for Low Voltage VLSI Systems, IEEE Journal of Solid-State Circuits, Vol. 32, No. 5, May 1997, pp 701-712. Such technology itself requires additional bias current to be supplied to the composite differential pair transistor formed by the PMOS transistor and the NMOS transistor, which is equivalent to increasing power consumption of the passive RFID tag chip system. In addition, the dual-input differential structure has different differential amplifier gains in different common-mode input ranges, in other words, in the high input range near the power supply voltage and in the low input range near the zero-voltage ground, respectively. The difference of such loop gain in different input ranges will be affected by the high level or low level of the power supply voltage, the temperature drift, and the fluctuation of the semiconductor chip fabrication processing parameters. In the passive RFID tag chip system, such technology also affects the use efficiency of energy, causes the deviation of the bandgap reference output voltage, and, thus, has certain limitations.

BRIEF SUMMARY OF THE DISCLOSURE

Aiming at the problem that there are several metastable degenerate points in the feedback loop due to the limited common-mode input voltage range of the internal differential amplifier in the bandgap reference circuit, the present disclosure provides a mixed-signal control circuit for eliminating the degenerate metastable state of the bandgap reference circuit, which may utilize a digital-to-analog converter (DAC) module with low-power consumption and flexibly customized accuracy as needed, a delay switch, and a non-volatile memory cell to directly control and clamp the circuit node in the degenerate metastable state in the bandgap reference circuit module, and to release the clamping after a certain delay. Such control mechanism may effectively prevent the self-biased bandgap reference circuit with an operational amplifier from entering the degenerate metastable state, and may enhance the robustness of the circuit, such that the reference circuit may start normally under various conditions. The present disclosure provides a general technical scheme that is widely used to eliminate various metastable degenerate points.

To achieve the above purposes, the technical scheme adopted by the present disclosure may include a mixed signal control circuit for eliminating a degenerate metastable state of a bandgap reference circuit, including: a start-up circuit, a mirror current unit, a self-biased bandgap reference temperature compensation loop circuit, an output circuit and a degenerate state elimination circuit, where:

the degenerate state elimination circuit includes a non-volatile memory cell, a digital-to-analog conversion module and a delay switch unit, where the non-volatile memory cell has stored preset binary data, which corresponds to a voltage value set by a key node in the self-biased bandgap reference temperature compensation loop circuit, an input terminal of the digital-to-analog conversion module is connected to a clock signal module and the non-volatile memory cell, and is configured to convert the binary data stored in the non-volatile memory cell into an analog signal, which is outputted as a transmission signal through the delay switch unit and connected to a node that needs to be clamped by a voltage in the self-biased bandgap reference temperature compensation loop circuit; at the same time, an output identification signal outputted by the digital-to-analog conversion module is connected to a delay signal input terminal of the delay switch unit, where the output identification signal maintains a low-level state before the digital-to-analog conversion module completes the conversion from the binary data to the analog voltage signal, and is set to a logic high-level after the digital-to-analog conversion module completes the digital-to-analog conversion, and an initial state of a delay switch is a turned-on state, when the output identification signal of the digital-to-analog conversion module reaches a control gate of the switch after a certain delay, the switch is turned off; when the circuit starts, the delay switch is in the initial turned-on state, a system reads the data in the non-volatile memory cell, and generates a clamping voltage value through the digital-to-analog conversion module, which is connected to the clamping node in the self-biased bandgap reference circuit; driven by the voltage of the clamping node, a differential amplifier in the self-biased bandgap reference temperature compensation loop circuit directly enters a design-required DC operating point, and establishes a feedback loop with effective error correction capability; when the establishment process completes, the delay switch is turned off; and the degenerate state elimination circuit completes its task and no longer affects the bandgap reference circuit, thereby preventing the bandgap reference circuit from falling into the degenerate metastable state due to the limitations of loop bandwidth and loop gain during start-up process.

To achieve the technical scheme of the present disclosure, the degenerate state elimination circuit includes the non-volatile memory cell, the digital-to-analog conversion module and the delay switch unit, after the non-volatile memory cell reads the binary data stored therein, the data is inputted to the digital-to-analog conversion module, and the digital-to-analog conversion module converts the digital input signal into an analog signal and inputs the analog signal to the delay switch unit, and the delay switch unit is formed by a delay generation circuit, an inverter and a transmission gate circuit, where two control gates of the transmission gate circuit are controlled by an output signal and an inverted output signal of the delay generation circuit, respectively, and a delay signal input terminal of the delay switch unit is connected to an output identification signal output terminal of the digital-to-analog conversion module.

The beneficial effects of the present disclosure may include that the problem of metastable degenerate point faced by the bandgap reference circuit may be fully solved. When the bandgap reference circuit is integrated into a main system, such feature may make the system integration task fully eliminate the concern of the bandgap reference circuit falling into the metastable degenerate point. Without the above concerns, the bandgap reference circuit itself may adopt the most optimized low-power and low-voltage design technology to improve the competitiveness of the product.

On the other hand, because the digital information in the non-volatile memory cell is written in the wafer inspection or chip cost inspection stage, the present disclosure may greatly reduce the scrap rate directly correlated with the bandgap reference module and caused by the deviation or fluctuation of the semiconductor manufacturing process.

DETAILED DESCRIPTION

The technical solutions in the disclosed embodiments of the present disclosure will be clearly and fully described below with reference to the accompanying drawings in the embodiments of the present disclosure. Obviously, the described embodiments are only a part of the embodiments of the present disclosure, but are not all of the embodiments. Based on the disclosed embodiments of the present disclosure, all other embodiments obtained by those of ordinary skill in the art without creative efforts shall fall within the protection scope of the present disclosure.

Figure 1:
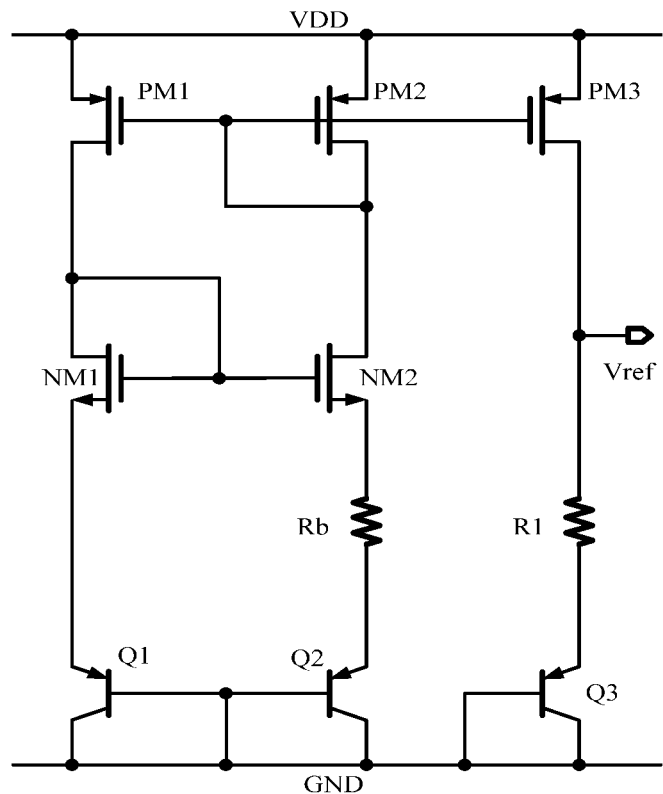
FIG. 1 illustrates a schematic diagram of a bandgap reference circuit with a constant Gm bias.
Figure 2:
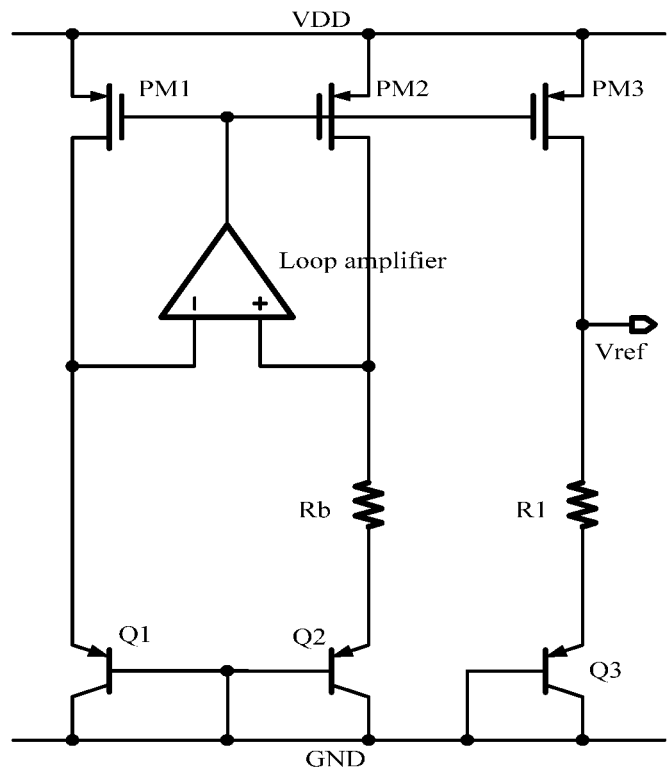
FIG. 2 illustrates a schematic diagram of a bandgap reference circuit with a loop amplifier.
Figure 3:
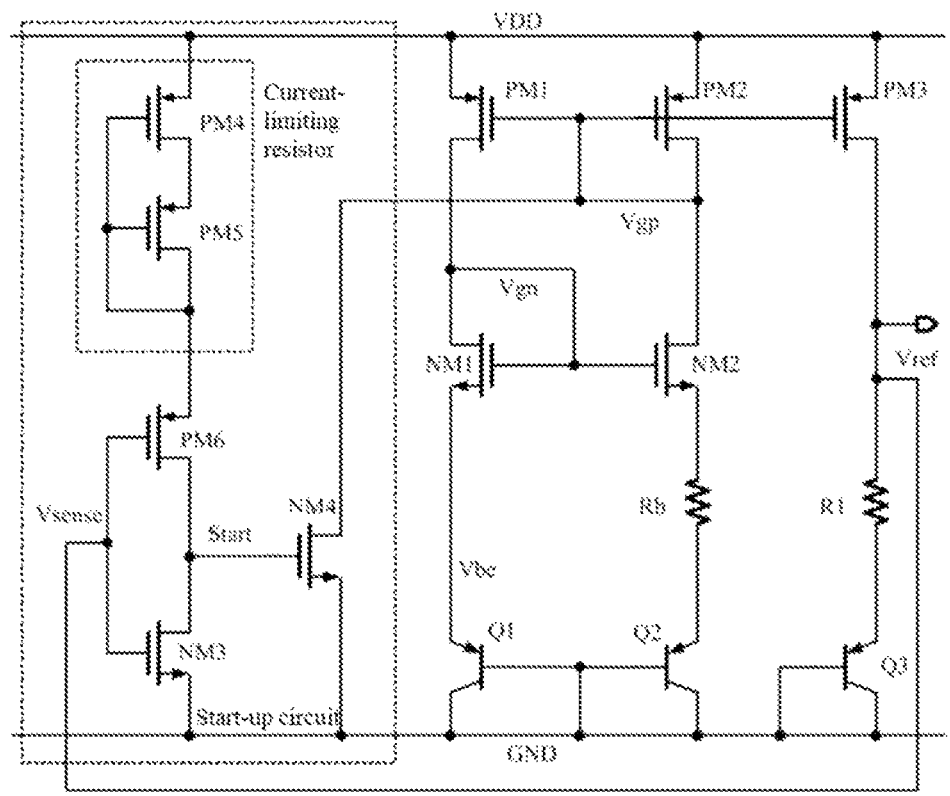
FIG. 3 illustrates a schematic diagram of a bandgap reference circuit with a constant Gm bias and a start-up circuit.
Figure 4:
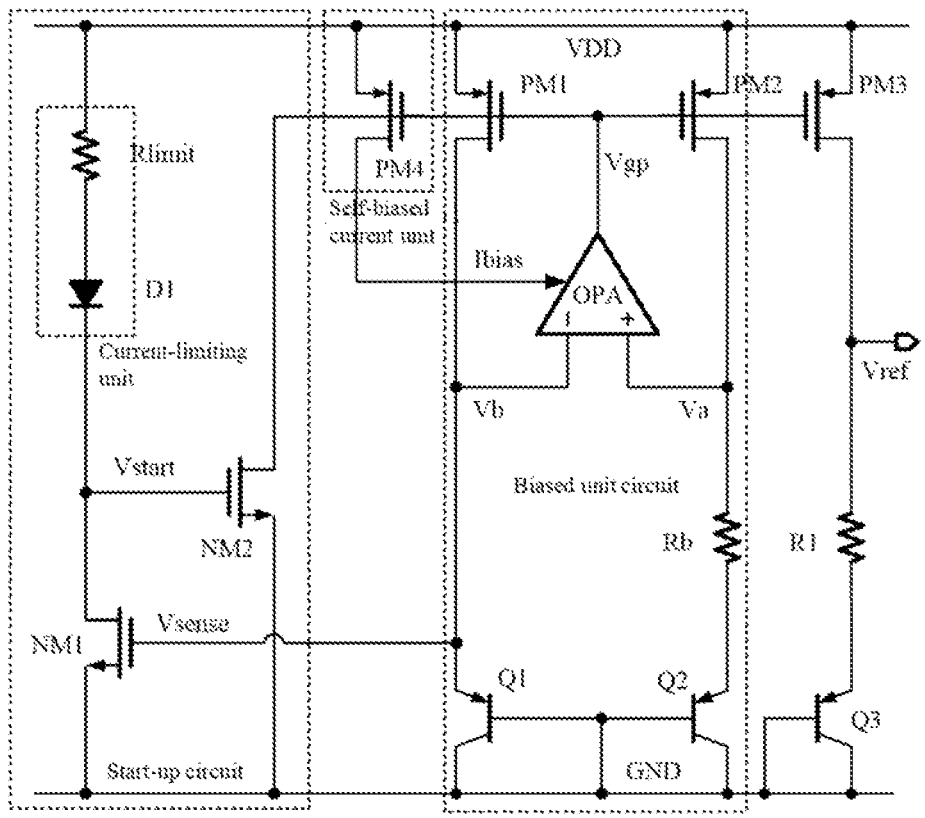
FIG. 4 illustrates a schematic diagram of a bandgap reference circuit with a loop amplifier and a start-up circuit.
Figure 5:
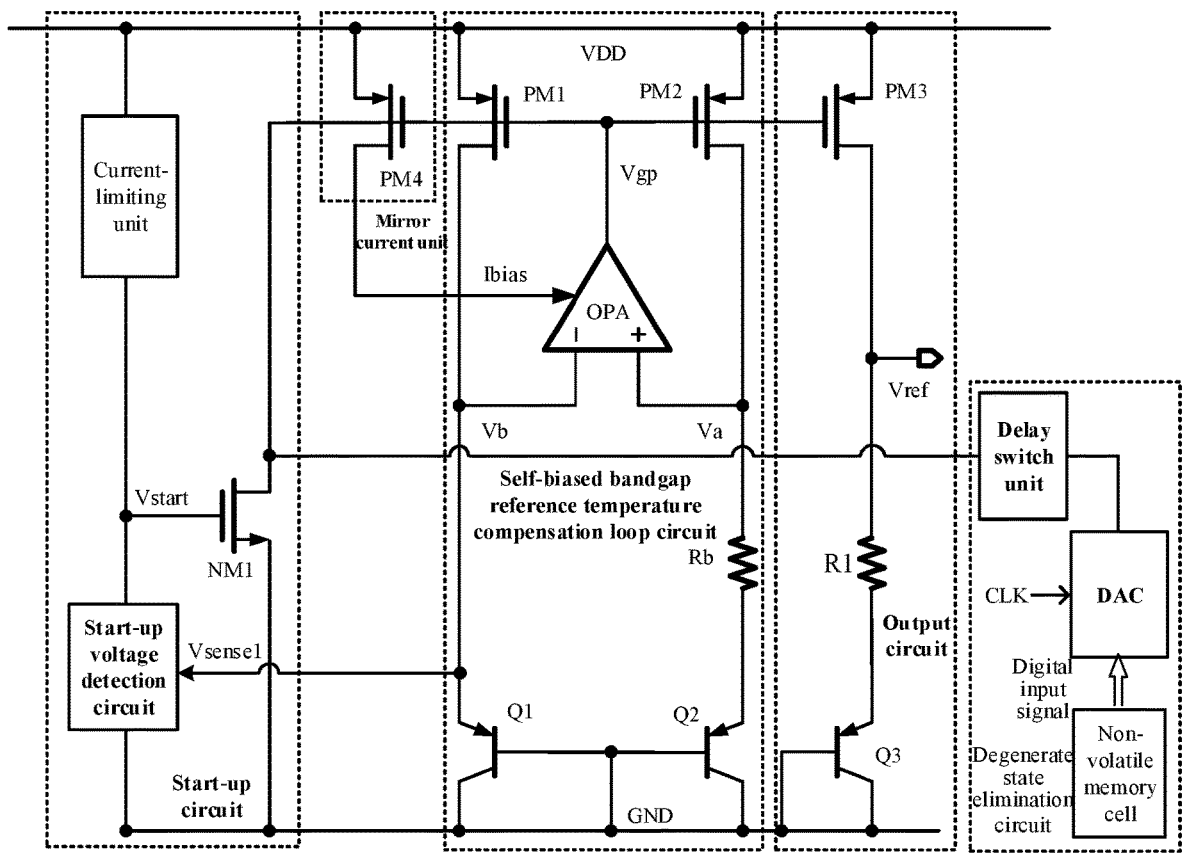
FIG. 5 illustrates a schematic diagram of a self-biased bandgap reference circuit with a degenerate state elimination circuit consistent with Embodiment 1 of the present disclosure.

Referring to FIG. 5, a mixed-signal control circuit for eliminating a degenerate metastable state of a bandgap reference circuit may include a start-up circuit, a mirror current unit, a self-biased bandgap reference temperature compensation loop circuit, an output circuit and a degenerate state elimination circuit.

The degenerate state elimination circuit may include a non-volatile memory cell, a digital-to-analog conversion module and a delay switch unit. The non-volatile memory cell may have stored preset binary data, which may correspond to a voltage value set by a key node (e.g., a node that is clamped by the voltage) in the self-biased bandgap reference temperature compensation loop circuit.

An input terminal of the digital-to-analog conversion module may be connected to a clock signal module and the non-volatile memory cell, and may be configured to convert the binary data stored in the non-volatile memory cell into an analog signal, which may be outputted as a transmission signal through the delay switch unit and connected to the node that needs to be clamped by the voltage in the self-biased bandgap reference temperature compensation loop circuit. At the same time, the output identification signal outputted by the digital-to-analog conversion module may be connected to a delay signal input terminal of the delay switch unit. The output identification signal may maintain a low level state before the digital-to-analog conversion module completes the conversion from the binary data to the analog voltage signal, and may be set to a logic high level after the digital-to-analog conversion module completes the digital-to-analog conversion.

An initial state of the delay switch may be a turned-on state. When the output identification signal of the digital-to-analog conversion module reaches a control gate of the switch after a certain delay, the switch may be turned off. When the circuit is started, the delay switch may be in an initial turned-on state. The system may read the data in the non-volatile memory cell, and may generate a clamping voltage value through the digital-to-analog conversion module, which may be connected to the clamping node in the self-biased bandgap reference circuit. Driven by the voltage of the clamping node, the differential amplifier in the self-biased bandgap reference temperature compensation loop circuit may directly enter the DC operating point required by the design, and may establish a feedback loop with effective error correction capability. When the establishment process is completed, the delay switch may be turned off. The degenerate state elimination circuit may complete its task and no longer affect the bandgap reference circuit, thereby avoiding the bandgap reference circuit falling into the degenerate metastable state due to the limitation of loop bandwidth and loop gain during startup.

Within the scope of applications considered by the present disclosure, when the bandgap reference circuit starts up, due to the limitation of the bandwidth of the bandgap reference loop and the limitation of the loop gain, the two input terminals of the amplifier cannot enter the most optimal DC operating point at first, and cannot quickly perform error correction relying on the feedback loop to reach the desired DC operating point. In view of this, the bandgap reference circuit may face such degenerate metastable state, and may eventually fail to complete the start-up and keep falling into the degenerate metastable state. Due to the function of the auxiliary start-up circuit formed by the non-volatile memory cell array, the digital-to-analog conversion (DAC) module and the delay switch in the present disclosure, the amplifier may be driven by the output voltage of the degenerate state elimination circuit for a period of time, and, thus, may directly enter the DC operating point required by the design, to establish the feedback loop with effective error correction capability. After the establishment process is completed, the delay switch may be turned off, and the degenerate state elimination circuit may complete its task and no longer affect the bandgap reference circuit.

As mentioned earlier, the feedback loop may lose error correction capability because the differential amplifier loses most of its differential amplification capability beyond its common-mode input range, and in turn, the differential amplifier entering the proper common-mode input range may depend on the role of the feedback loop, these two contradictory factors that influence each other may lead to the existence of the degenerate metastable state. The present disclosure may be equivalent to introducing external factors to the bandgap reference voltage circuit by the clamping point. With the help of the external factors, the entire bandgap reference self-starting process may be fully prevented from entering the degenerate state.

When the clamping node is the input common-mode point Vgp of the differential amplifier shown in FIG. 5, the function of the clamping node may include directly introducing a suitable common-mode input range for the differential amplifier, to ensure that the differential amplifier may have a sufficiently large gain. In other words, the temperature compensation loop of the bandgap reference voltage may have sufficient feedback and error correction capabilities. Under such conditions, the bandgap reference voltage circuit may reliably establish the expected DC operating point. Referring to Embodiment 1 in FIG. 5, the output terminal of the digital-to-analog conversion module may be outputted to the common-mode point, Vgp, of the self-biased bandgap reference temperature compensation loop circuit through the delay switch unit, and may be configured to perform a voltage clamping operation on the common-mode voltage point through a preset analog voltage value during the start-up process. Relying on the output driving capability of the digital-to-analog conversion module, the current bias of the differential amplifier and the bias current of the error correction loop may be forced to be correctly established, such that the bandgap reference voltage module may enter the correct DC operating point, thereby eliminating the possibility of the bandgap reference circuit entering degenerate metastable state.

Figure 6:
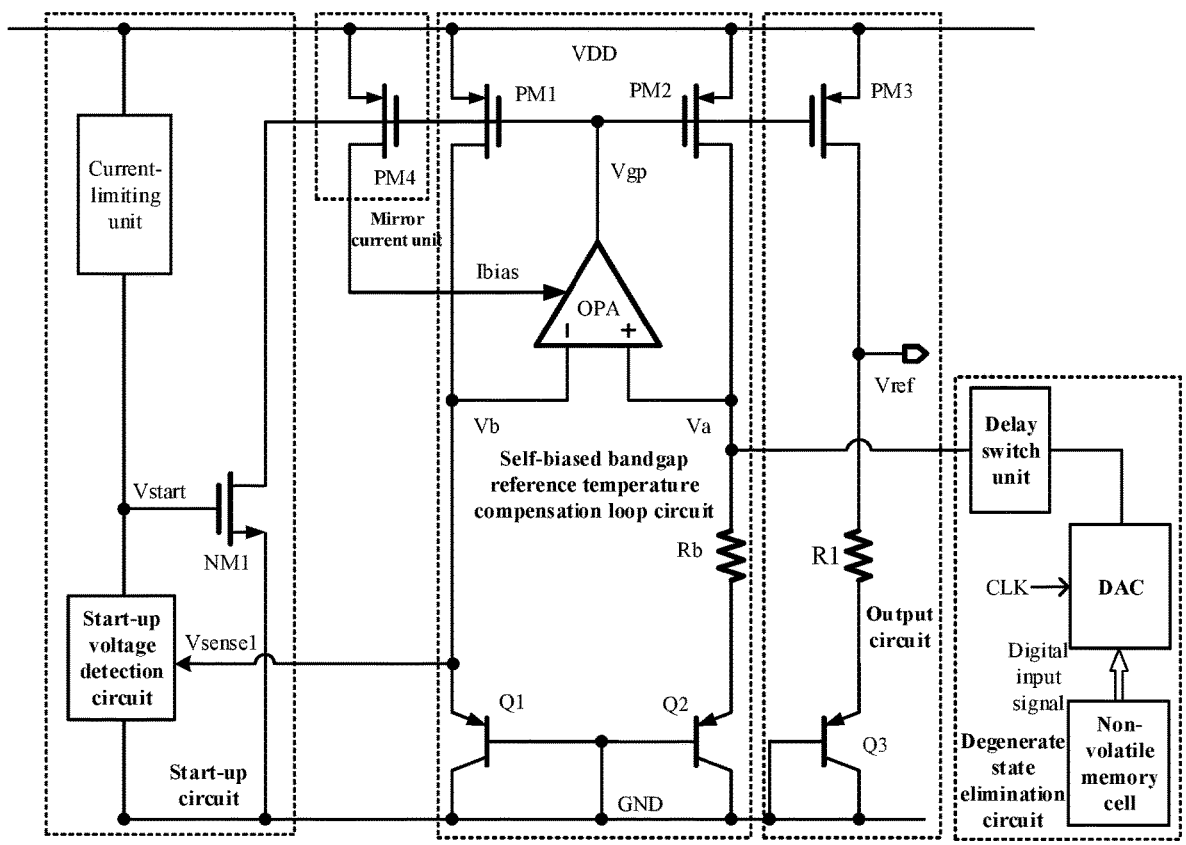
FIG. 6 illustrates a schematic diagram of a self-biased bandgap reference circuit with a degenerate state elimination circuit consistent with Embodiment 2 of the present disclosure.
Figure 7:
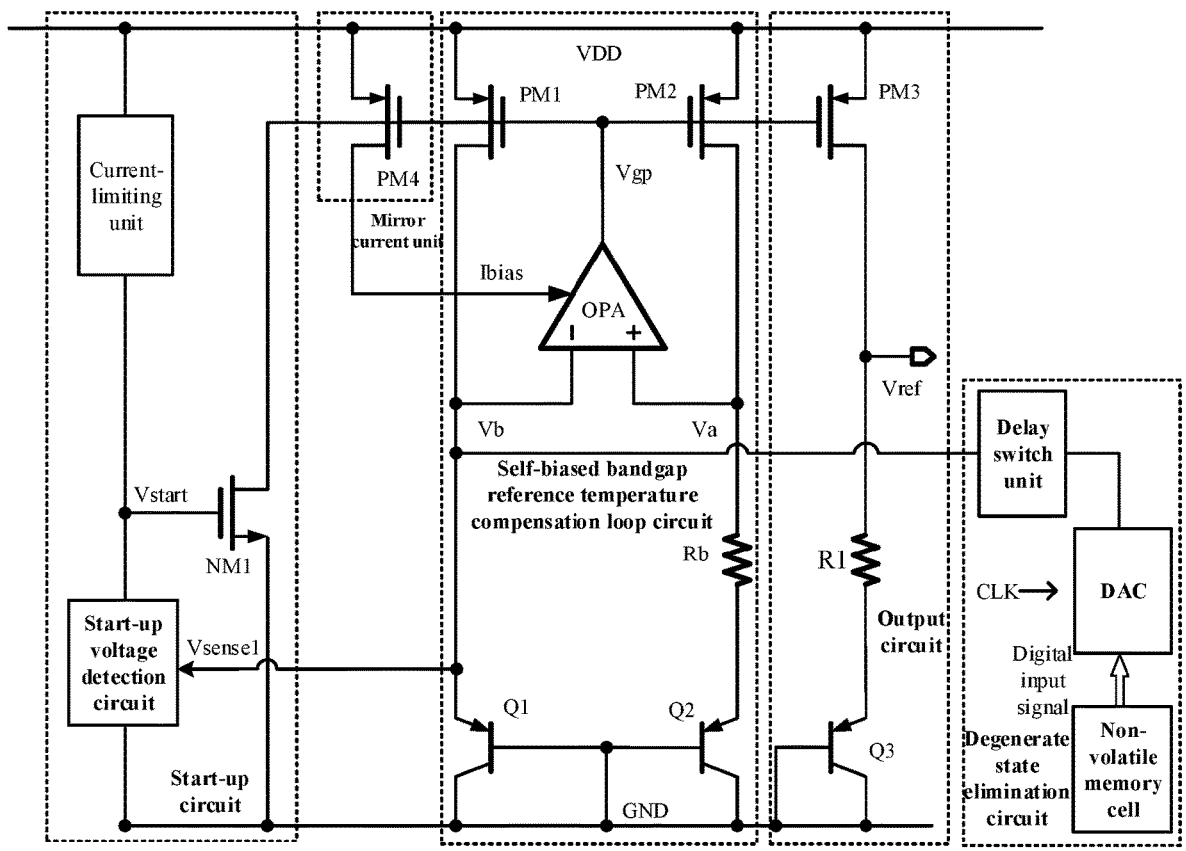
FIG. 7 illustrates a schematic diagram of a self-biased bandgap reference circuit with a degenerate state elimination circuit consistent with Embodiment 3 of the present disclosure.

When the clamping node is a certain differential mode input point of the differential amplifier, even if the voltage of the other point of the differential input is inconsistent with the voltage of the clamped point during the start-up process, because the differential amplifier deviates from the degenerate point and operates in a working region with sufficient differential gain, after the clamping operation is completed, in other words, after the delay switch is turned off, under the error correction effect of the feedback loop, the differential amplifier may still reliably establish a balanced DC operating point consistent with the intended design. Referring to Embodiment 2 in FIG. 6, the output terminal of the digital-to-analog conversion module may be connected to a positive input terminal, Va, of the self-biased bandgap reference temperature compensation loop circuit through the delay switch unit. Alternatively, referring to Embodiment 3 in FIG. 7, the output terminal of the digital-to-analog conversion module may be connected to a negative input terminal, Vb, of the self-biased bandgap reference temperature compensation loop circuit through the delay switch unit.

In all the above-disclosed embodiments, no matter whether the output terminal of the delay switch is connected to Va, Vb, or the common-mode point Vgp (hereinafter collectively referred to as the connection point), the principle may be summarized as that during the start-up process, a voltage clamping operation may be respectively performed on the above connection points (positive input terminal, negative input terminal and common-mode point) through a preset analog voltage value, and relying on the output driving capability of the DAC module, the voltages of the above connection points may be forced to be stabilized at the preset analog voltage values, thereby substantially reliably eliminating the possibility of the bandgap reference circuit entering the degenerate metastable state. The clamped preset analog voltage value may be approximately equal to a voltage value obtained by calculating and measuring the DC operating point of the bandgap reference circuit under normal operating conditions, in other words, the voltage value to which these connection points have to eventually settle after the start-up process, such that the clamping operation may not have any negative impact on the operation of the circuit. The action of the delay switch may ensure that the voltage clamping operation remains active for a certain period of time, especially when the start-up process is not completed. Due to the action of the feedback loop, the connection point that is clamped to the correct voltage value may affect other nodes in the bandgap reference circuit to enable the other nodes to be substantially and quickly stabilized at the correct DC operating point voltage, and may play a role in assisting the completion of the self-starting process.

The degenerate state elimination circuit may include the non-volatile memory cell, the digital-to-analog conversion module and the delay switch unit.

After the non-volatile memory cell reads the binary data stored therein, the data may be inputted to the digital-to-analog conversion module, and the digital-to-analog conversion module may convert the digital input signal into an analog signal and input the analog signal to the delay switch unit.

The delay switch unit may be formed by a delay generation circuit, an inverter and a transmission gate circuit, where two control gates of the transmission gate may be controlled by the output signal of the delay generation circuit and its inverted output signal, respectively. The delay signal input terminal of the delay switch unit may be connected to the output identification signal output terminal of the digital-to-analog conversion module.

Herein, the non-volatile memory cell described in the present disclosure may typically be formed by a storage media cell array in units of bit or Byte, an address decoder, a data read circuit and a logic control circuit. The non-volatile storage media may refer to storage media that is capable of retaining data without external power supply. The typical non-volatile storage media built into chips may include electrically erasable programmable read only memory (EEPROM) and flash memory, which may play a role in maintaining data in the passive RFID system. When the passive RFID tag is fully inactive, the pre-written data therein may be retained for up to 10 years without lapse or change. The non-volatile unit may store N-bit digital information, such as 4 bits, 6 bits, or even 8 bits, which may be determined by the adjustment step size of the input range to be adjusted in the present disclosure. When the system is working (obviously, the bandgap reference module considered in the present disclosure is not the first module in the system to enter the working state after being powered on, while is a bandgap reference module in a sub-module embedded in a substantially large system that first enters the working state), the N-bit data may be inputted into an N-bit digital-to-analog conversion DAC module, and the analog voltage value obtained by the DAC module after conversion may be simultaneously connected to the two input terminals of the OPA amplifier in the Figure through the delay switch, which may lead to the common-mode input state. The delay switch may be turned off after a preset delay time, such that the voltages of the two input terminals of the differential amplifier may be determined by the bandgap reference feedback loop. The preset delay time may be determined by an external clock signal, or may be determined by an analog delay network formed by resistors and capacitors. The delay time should be roughly equivalent to the time constant of the bandgap reference feedback loop, which may be equal to 1/f, where f=loop bandwidth.

The digital information in the non-volatile memory cell array may be determined according to the process inspection after the chip production is completed. For example, when the process deviation is large, a digital value suitable for the large process deviation may be written. On the contrary, after testing under normal process conditions, a digital value that is very close to the ultimately designed DC operating point may be written. In short, the present disclosure may greatly reduce the defective ratio of the bandgap reference modules caused by process deviation, and may improve the product adaptability, i.e., the yield.

In the present disclosure, the non-volatile memory cell may be a module with a non-volatile storage function in various forms existing in the industry, which may not be described herein. After the non-volatile memory cell reads the binary data stored therein, the data may be inputted to the digital-to-analog conversion module, and the digital-to-analog conversion module may convert the digital input signal into an analog signal, which may be inputted to the delay switch unit.

The digital-to-analog conversion module described in the present disclosure may be various existing circuit modules with analog-to-digital conversion function in the industry without losing the essence of simple structure and ultra-low power consumption, which may not require the static performance or dynamic performance with substantially high indicator, such that a very simple design may be used to save costs. The conversion accuracy may be the simplest 2 bits, or may be a slightly higher accuracy to improve the fineness of adjusting the input voltage of the differential amplifier in the bandgap reference circuit, and the specific value may be derived from the allowable difference between the voltage value that the clamping node needs to reach and the preset ideal analog voltage value, or may be derived from the degree of deviation of the voltage of the clamping node deviating from the known degenerate point voltage value, which may not be described herein. The voltage driving capability of the digital-to-analog conversion module to the clamping node may need to ensure that before the delay switch is turned off, the voltage of the clamping node may be fully stabilized at the analog voltage value converted by the digital-to-analog converter, and there may be no obvious voltage fluctuation or the transient change of voltage. While the digital-to-analog conversion module converts the binary data into analog voltage and outputs the analog voltage to the transmission signal input terminal of the delay switch, the output identification signal of the digital-to-analog conversion module may also be outputted to the delay signal input terminal of the delay switch.

The above-disclosed delay switch unit in the present disclosure may be formed by the delay generation circuit, the inverter and the transmission gate circuit, where the two control gates of the transmission gate may be controlled by the output signal DAC_Complete_Delayed and inverted output signal DAC_Complete_Delayed of the delay generation circuit, respectively. The delay signal may be generated by an analog circuit. In other words, the output identification signal of the digital-to-analog conversion module may be connected to a low-pass filter, where a cut-off frequency of the low-pass filter may determine the delay time experienced by the delay signal, also known as asynchronous delay. The delay signal may also be realized by digital implementation. After being divided by the frequency dividing circuit, the system clock signal may perform logical "AND" operation with the output identification signal to obtain and output a synchronous delay. The delay time reached by the delay signal may be roughly not less than the response time of the entire bandgap reference temperature compensation loop circuit. In other words, the delay time may be roughly comparable to the time constant of the loop, such that the effect of the clamping operation may not be ignored by the loop due to the limitation of the loop bandwidth. Whether it is the asynchronous delay realized by analog mode or the synchronous delay realized by digital logic mode, the delay switch may be in the turned-on state at the beginning of the start-up of the bandgap reference circuit, and may be turned off after the delay. After the delay switch is turned off, the effect of the start-up of the degenerate state elimination circuit on the bandgap reference circuit may be terminated, and in view of this, the bandgap reference circuit may have reliably completed start-up without entering the degenerate metastable state.

Figure 8:
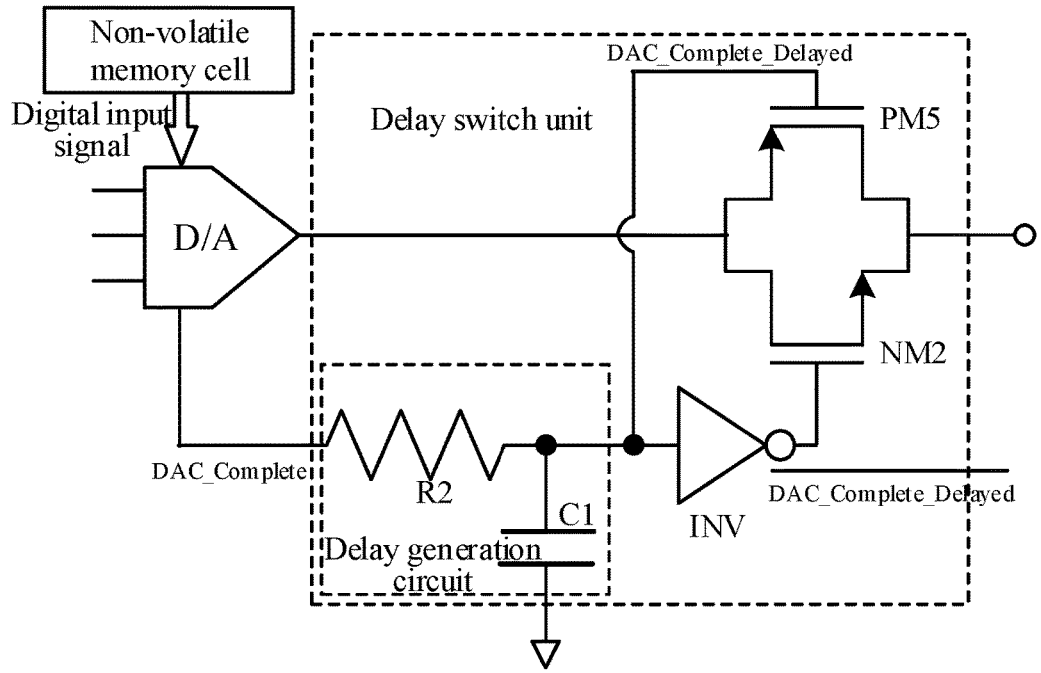
FIG. 8 illustrates a schematic diagram of a delay generation circuit formed by an analog circuit in a degenerate state elimination circuit consistent with various embodiments of the present disclosure.

When the delay signal is generated by an analog circuit, the specific circuit structure may be shown in FIG. 8. The delay generation circuit may include a second resistor R2 and a first capacitor C1. The second resistor R2 and the first capacitor C1 may form the low-pass filter, and an output terminal of the low-pass filter may be connected to the first control gate of the transmission gate circuit formed by the fifth P-type MOS transistor PM5 and the second N-type MOS transistor NM2. The output terminal of the low-pass filter may also be connected to the second control gate of the transmission gate circuit through the first inverter INV. The input terminal of the transmission gate circuit may be connected to the output terminal of the digital-to-analog conversion module, and the output terminal of the transmission gate circuit may be connected to the voltage-clamped node in the bandgap reference circuit.

The above delay generation circuit may generate delay by an analog RC low-pass filter, and the input signal of the filter may be the output identification signal DAC_Complete controlled by the DAC. In other words, after the DAC digital-to-analog conversion is completed, the given DAC_Complete signal may pass through the RC delay to form the delay signal DAC_Complete_Delayed. One channel of the delay signal DAC_Complete_Delayed may be directly inputted to the first control gate of the transmission gate circuit, and the other channel of the delay signal may pass through the inverter to form DAC_Complete_Delayed, which may be inputted to the second control gate of the transmission gate circuit.

Figure 9:
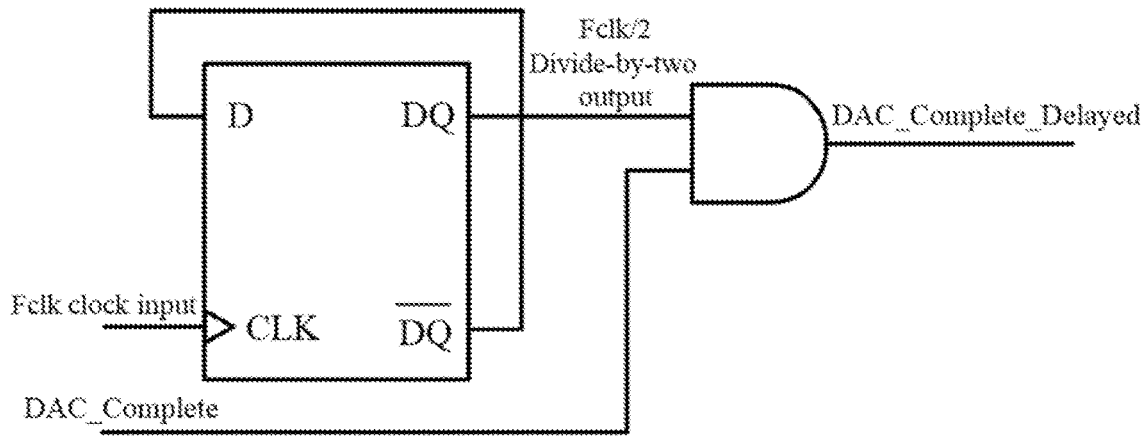
FIG. 9 illustrates a schematic diagram of a delay generation circuit formed by a digital circuit in a degenerate state elimination circuit consistent with Embodiment 1 of the present disclosure.
Figure 10:
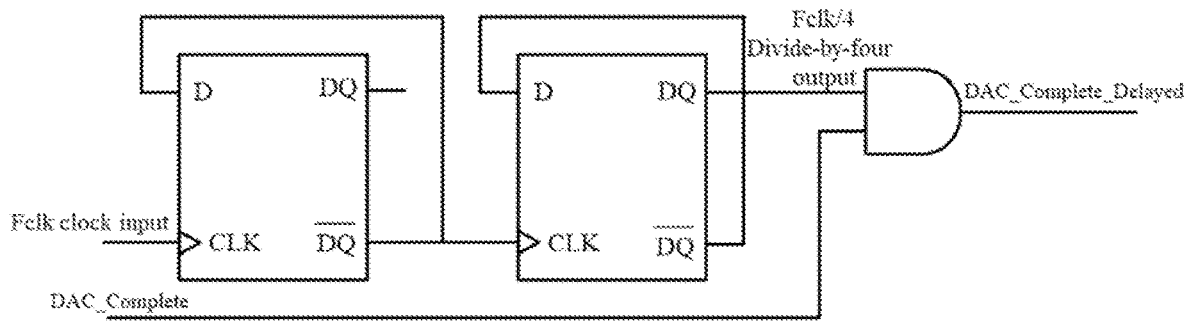
FIG. 10 illustrates a schematic diagram of a delay generation circuit formed by a digital circuit in a degenerate state elimination circuit consistent with Embodiment 2 of the present disclosure.
Figure 11:
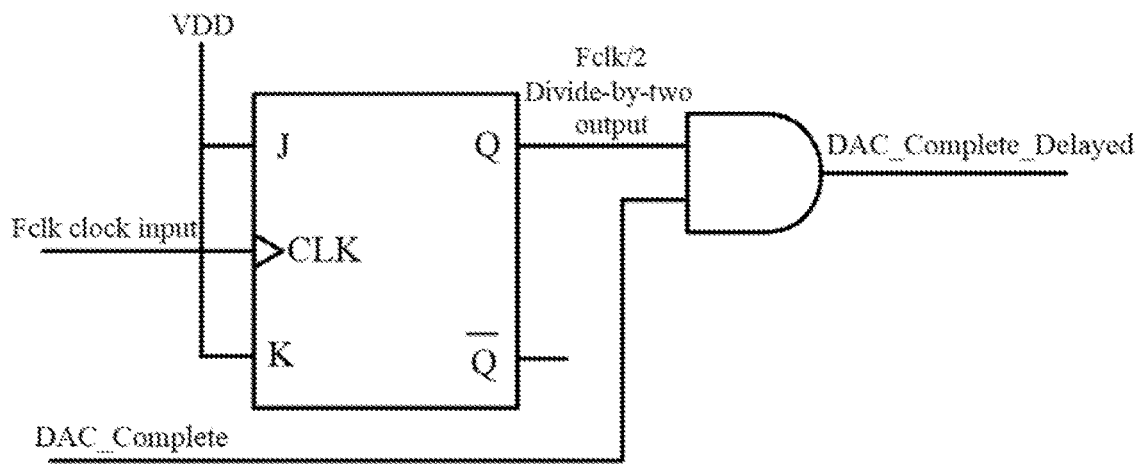
FIG. 11 illustrates a schematic diagram of a delay generation circuit formed by a digital circuit in a degenerate state elimination circuit consistent with Embodiment 3 of the present disclosure.
Figure 12:
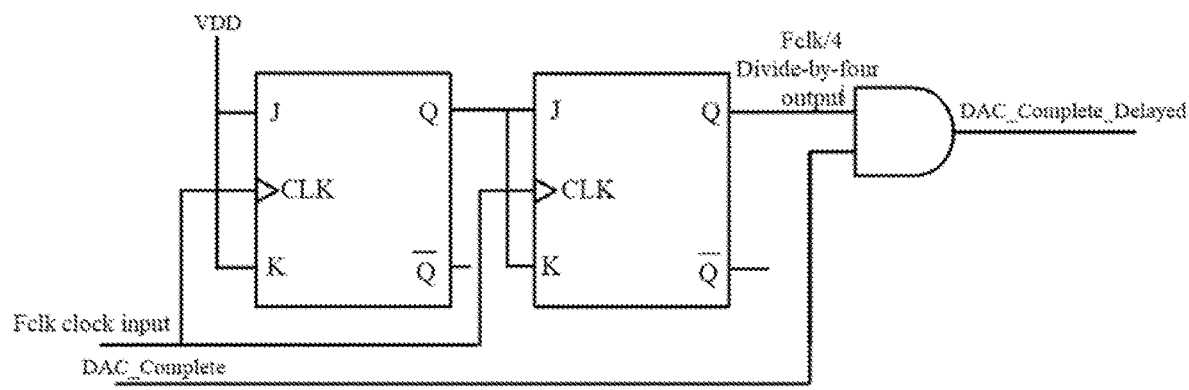
FIG. 12 illustrates a schematic diagram of a delay generation circuit formed by a digital circuit in a degenerate state elimination circuit consistent with Embodiment 4 of the present disclosure.

Similarly, when the delay synchronized with the clock signal is generated in a digital mode, the input signal of the delayed part may be the clock signal, and a divide-by-two delay or a divide-by-four delay may be generated by the D flip-flop. The divide-by-two delay or divide-by-four delay may perform the logical "AND" operation with the output identification signal DAC_Complete of the digital-to-analog conversion module to form the delay signal DAC_Complete_Delayed. One channel of the delay signal DAC_Complete_Delayed may be directly inputted to the first control gate of the transmission gate circuit, and the other channel of the delay signal may pass through the inverter to form DAC_Complete_Delayed, which may be inputted to the second control gate of the transmission gate circuit, as shown in FIG. 9 and FIG. 10. Alternatively, the divide-by-two delay or the divide-by-four delay may be generated by the JK flip-flop. The divide-by-two delay or divide-by-four delay may perform the logical "AND" operation with the output identification signal DAC_Complete of the digital-to-analog conversion module, and the delay signal DAC_Complete_Delayed and DAC_Complete_Delayed may be inputted to the first and second control gates of the transmission gate circuit, respectively, as shown in FIG. 11 and FIG. 12.

The beneficial effects of the present disclosure may include that the problem of metastable degenerate point faced by the bandgap reference circuit may be fully solved. When the bandgap reference circuit is integrated into a main system, such feature may make the system integration task fully eliminate the concern of the bandgap reference circuit falling into the metastable degenerate point. Without the above concerns, the bandgap reference circuit itself may adopt the most optimized low-power and low-voltage design technology to improve the competitiveness of the product. On the other hand, because the digital information in the non-volatile memory cell is written in the wafer inspection or chip cost inspection stage, the present disclosure may greatly reduce the scrap rate directly correlated with the bandgap reference module and caused by the deviation or fluctuation of the semiconductor manufacturing process.

What is claimed is:

1. A mixed signal control circuit for eliminating a degenerate metastable state of a bandgap reference circuit, comprising: a start-up circuit, a mirror current unit, a self-biased bandgap reference temperature compensation loop circuit, an output circuit and a degenerate state elimination circuit, wherein:

the degenerate state elimination circuit includes a non-volatile memory cell, a digital-to-analog conversion module and a delay switch unit, wherein the non-volatile memory cell has stored preset binary data, which corresponds to a voltage value set by a key node in the self-biased bandgap reference temperature compensation loop circuit, an input terminal of the digital-to-analog conversion module is connected to a clock signal module and the non-volatile memory cell, and is configured to convert the binary data stored in the non-volatile memory cell into an analog signal, which is outputted as a transmission signal through the delay switch unit and connected to a node that needs to be clamped by a voltage in the self-biased bandgap reference temperature compensation loop circuit; at the same time, an output identification signal outputted by the digital-to-analog conversion module is connected to a delay signal input terminal of the delay switch unit, wherein the output identification signal maintains a low-level state before the digital-to-analog conversion module completes the conversion from the binary data to the analog voltage signal, and is set to a logic high-level after the digital-to-analog conversion module completes the digital-to-analog conversion, and an initial state of the delay switch unit is a turned-on state, when the output identification signal of the digital-to-analog conversion module reaches a control gate of the delay switch unit after a certain delay, the delay switch unit is turned off; when the circuit starts, the delay switch unit is in the initial turned-on state, a system reads the data in the non-volatile memory cell, and generates a clamping voltage value through the digital-to-analog conversion module, which is connected to the clamping node in the self-biased bandgap reference circuit; driven by the voltage of the clamping node, a differential amplifier in the self-biased bandgap reference temperature compensation loop circuit directly enters a design-required DC operating point, and establishes a feedback loop with effective error correction capability; when the establishment process completes, the delay switch unit is turned off; and the degenerate state elimination circuit completes its task and no longer affects the bandgap reference circuit, thereby preventing the bandgap reference circuit from falling into the degenerate metastable state due to the limitations of loop bandwidth and loop gain during start-up process.

2. The mixed signal control circuit for eliminating the degenerate metastable state of the bandgap reference circuit according to claim 1, wherein: an output terminal of the digital-to-analog conversion module is outputted to a common-mode point of the self-biased bandgap reference temperature compensation loop circuit through the delay switch unit, and is configured to perform a voltage clamping operation on the common-mode voltage point through a preset analog voltage value during the start-up process, wherein relying on output driving capability of the digital-to-analog conversion module, a current bias of the differential amplifier and a bias current of an error correction loop are forced to be correctly established, such that the bandgap reference voltage module enters the correct DC operating point, thereby eliminating the possibility of the bandgap reference circuit entering the degenerate metastable state.

3. The mixed signal control circuit for eliminating the degenerate metastable state of the bandgap reference circuit according to claim 1, wherein: an output terminal of the digital-to-analog conversion module is connected to a positive input terminal of the self-biased bandgap reference temperature compensation loop circuit through the delay switch unit, and is configured to perform a voltage clamping operation on the positive input terminal through a preset analog voltage value during the start-up process, wherein relying on output driving capability of the digital-to-analog conversion module, the voltage of the positive input terminal is forced to be stabilized at the preset analog voltage value, thereby eliminating the possibility of the bandgap reference circuit entering the degenerate metastable state.

4. The mixed signal control circuit for eliminating the degenerate metastable state of the bandgap reference circuit according to claim 1, wherein: an output terminal of the digital-to-analog conversion module is connected to an negative input terminal of the self-biased bandgap reference temperature compensation loop circuit through the delay switch unit, and is configured to perform a voltage clamping operation on the negative input terminal through a preset analog voltage value during the start-up process, wherein relying on output driving capability of the digital-to-analog conversion module, the voltage of the negative input terminal is forced to be stabilized at the preset analog voltage value, thereby eliminating the possibility of the bandgap reference circuit entering the degenerate metastable state.

5. The mixed signal control circuit for eliminating the degenerate metastable state of the bandgap reference circuit according to claim 1, wherein: the degenerate state elimination circuit includes the non-volatile memory cell, the digital-to-analog conversion module and the delay switch unit, after the non-volatile memory cell reads the binary data stored therein, the data is inputted to the digital-to-analog conversion module, and the digital-to-analog conversion module converts the digital input signal into an analog signal and inputs the analog signal to the delay switch unit, and the delay switch unit is formed by a delay generation circuit, an inverter and a transmission gate circuit, wherein two control gates of the transmission gate circuit are controlled by an output signal and an inverted output signal of the delay generation circuit, respectively, and a delay signal input terminal of the delay switch unit is connected to an output identification signal output terminal of the digital-to-analog conversion module.

6. The mixed signal control circuit for eliminating the degenerate metastable state of the bandgap reference circuit according to claim 5, wherein: when the delay generation circuit is an analog circuit, the delay generation circuit includes a second resistor R2 and a first capacitor C1, wherein the second resistor R2 and the first capacitor C1 form a low-pass filter, and an output terminal of the low-pass filter is connected to a first control gate of the transmission gate circuit formed by a fifth P-type MOS transistor PM5 and a second N-type MOS transistor NM2, and the output terminal of the low-pass filter is further connected to a second control gate of the transmission gate circuit through a first inverter INV, an input terminal of the transmission gate circuit is connected to an output terminal of the digital-to-analog conversion module, and an output terminal of the transmission gate circuit is connected to the voltage-clamped node in the bandgap reference circuit.

7. The mixed signal control circuit for eliminating the degenerate metastable state of the bandgap reference circuit according to claim 5, wherein: when the delay generation circuit is a digital circuit, an input signal of the delayed part is a clock signal, and a divide-by-two delay or a divide-by-four delay is generated by a D flip-flop, wherein the divide-by-two delay or the divide-by-four delay performs a logical "AND" operation with the output identification signal of the digital-to-analog conversion module to form the delay signal.

8. The mixed signal control circuit for eliminating the degenerate metastable state of the bandgap reference circuit according to claim 5, wherein: when the delay generation circuit is a digital circuit, an input signal of the delayed part is a clock signal, and a divide-by-two delay or a divide-by-four delay is generated by a JK flip-flop, wherein the divide-by-two delay or the divide-by-four delay performs a logical "AND" operation with the output identification signal of the digital-to-analog conversion module to form the delay signal.

* * * * *